(12) United States Patent
Sun et al.

(10) Patent No.: US 11,950,090 B2
(45) Date of Patent: Apr. 2, 2024

(54) IN-CAR ADAPTIVE SOUND QUALITY OUTPUT METHOD, DEVICE, STORAGE MEDIUM AND CAR AUDIO SYSTEM

(71) Applicant: AAC Microtech (Changzhou) Co., Ltd., Changzhou (CN)

(72) Inventors: Shuyuan Sun, Shenzhen (CN); Yiming Meng, Shenzhen (CN); Hao Yin, Shenzhen (CN)

(73) Assignee: AAC Microtech (Changzhou) Co., Ltd., Changzhou (CN)

( * ) Notice: Subject to any disclaimer, the term of this patent is extended or adjusted under 35 U.S.C. 154(b) by 157 days.

(21) Appl. No.: 17/840,590

(22) Filed: Jun. 14, 2022

(65) Prior Publication Data
US 2023/0239652 A1    Jul. 27, 2023

(30) Foreign Application Priority Data
Jan. 26, 2022    (CN) .......................... 202210094610.7

(51) Int. Cl.
| | |
|---|---|
| H04R 5/02 | (2006.01) |
| H03F 3/21 | (2006.01) |
| H04R 5/04 | (2006.01) |
| H04S 3/00 | (2006.01) |
| H04S 7/00 | (2006.01) |
| H04B 1/00 | (2006.01) |

(52) U.S. Cl.
CPC .............. *H04S 7/307* (2013.01); *H03F 3/21* (2013.01); *H04R 5/02* (2013.01); *H04R 5/04* (2013.01); *H04S 3/008* (2013.01); *H03F 2200/03* (2013.01); *H04R 2499/13* (2013.01); *H04S 2400/01* (2013.01); *H04S 2400/13* (2013.01)

(58) Field of Classification Search
CPC ...... H04S 7/307; H04S 3/008; H04S 2400/01; H04S 2400/13; H03F 3/21; H03F 2200/03; H04R 5/02; H04R 5/04; H04R 2499/13
USPC ..................................................... 381/302, 86
See application file for complete search history.

(56) References Cited

U.S. PATENT DOCUMENTS

| | | | | |
|---|---|---|---|---|
| 2012/0063616 A1* | 3/2012 | Walsh | ..................... | H03G 5/025 381/103 |
| 2020/0412313 A1* | 12/2020 | Coover | .................. | H03G 7/007 |

* cited by examiner

*Primary Examiner* — Ammar T Hamid
(74) *Attorney, Agent, or Firm* — W&G Law Group

(57) ABSTRACT

The application relates to a sound quality output method. The method includes: obtaining the current volume level input by the user; determine the audio signal gain difference between the current volume level and the baseline volume level according to the current volume level and the preset baseline volume level, determining an equal loudness curve difference between the current volume level and the baseline volume level according to the audio signal gain difference, and the current volume level and the baseline volume level, determining the audio quality response curve corresponding to the current volume level according to the equal loudness curve difference and the pre-stored audio quality response curve corresponding to the baseline volume level, determining the output signal parameters of multiple audio output channels according to the audio quality response curve corresponding to the current volume level. The application optimizes the sound quality effect and enhances acoustic experience.

9 Claims, 5 Drawing Sheets

IN-CAR ADAPTIVE SOUND QUALITY OUTPUT METHOD, DEVICE, STORAGE MEDIUM AND CAR AUDIO SYSTEM

TECHNICAL FIELD

The invention relates to the technical field of vehicle electronics, in particular to an in-car adaptive sound quality output method, a device, a storage medium and a car audio system.

BACKGROUND ART

With the development of smart cars, users have higher and higher requirements for enjoyment, and car manufacturers are also paying more and more attention to the car's audio system. At present, although the car's audio system is arranged with no effect on the running performance of the car, it is arranged with become one of the indicators for evaluating the comfort of the car.

Existing car audio systems usually include multi-channel (for example, multiple speakers) audio outputs, which can provide users with rich sound quality experience. Users can customize the volume level according to the hearing characteristics of their ears. However, the inventor of the application found in research that the car audio system in the prior art simply adjusts the output volume of multiple channels according to the volume level set by the user, and does not adjust the sound quality adaptively. The user is likely to feel a large contrast in the effect before and after the volume adjustment, thereby reducing the user experience.

SUMMARY OF THE INVENTION

The embodiment of the present invention provides in-car adaptive sound quality output method, device, storage medium and car audio system, in the case of different volume levels, the car audio system can adaptively adjust the sound quality and control the output parameters of multiple output channels accordingly. Satisfy the hearing characteristics of the user's human ear and optimize the sound quality effect, thereby improving the user's acoustic experience.

Accordingly, the present application provides an in-car adaptive sound quality output method, including steps of: obtaining a current volume level entered by the user; determining an audio signal gain difference between the current volume level and a baseline volume level according to the current volume level and a preset baseline volume level, determining an equal loudness curve difference between the current volume level and the baseline volume level according to the audio signal gain difference, the current volume level and the baseline volume level; determining an audio quality response curve corresponding to the current volume level according to the equal loudness curve difference and the pre-stored audio quality response curve corresponding to the baseline volume level; and determining an output signal parameters of multiple audio output channels according to the audio quality response curve corresponding to the current volume level.

As an improvement, the step of determining the audio signal gain difference between the current volume level and the baseline volume level according to the current volume level and a preset baseline volume level, includes steps of: using the preset gain table to query, obtaining the gain value of the audio signal corresponding to the current volume level, according to the current volume level; using the preset gain table to query and obtaining the gain value of the audio signal corresponding to the baseline volume level according to the preset baseline volume level; carrying out difference calculation through the gain value of the audio signal corresponding to the baseline volume level, the gain value of the audio signal corresponding to the current volume level, obtaining the audio signal gain difference between the current volume level and the baseline volume level.

As an improvement, the step of determining the equal loudness curve difference between the current volume level and the baseline volume level according to the audio signal gain difference, and the current volume level and the baseline volume level, includes steps of: calculating the sound pressure level of the in-car preset reference position at the reference frequency point according to the baseline volume level, and further calculating the equal loudness curve corresponding to the baseline volume level; determining the equal loudness curve corresponding to the current volume level according to the equal loudness curve corresponding to the baseline volume level and the audio signal gain difference; calculating the equal loudness curve difference between the current volume level and the baseline volume level according to the equal loudness curve corresponding to the baseline volume level and the equal loudness curve corresponding to the current volume level.

As an improvement, the step of determining the audio quality corresponding to the current volume level according to the equal loudness curve difference and the pre-stored audio quality response curve corresponding to the baseline volume level response curve, includes steps of: using the pre-stored audio quality response curve corresponding to the baseline volume level, and the equal loudness curve difference, performing difference calculation, obtaining the audio quality response curve corresponding to the current volume level.

As an improvement, the audio quality response curve is specifically a frequency response curve.

As an improvement, the step of determining the output signal parameters of multiple audio output channels according to the audio quality response curve corresponding to the current volume level, includes steps of: determining the actual sound output signals of multiple audio output channels according to the audio quality response curve corresponding to the current volume level and the preset acoustic transfer relationship; comparing actual sound output signals of the multiple audio output channels with the respective original sound signals, then determining the adjustment parameters of the multiple audio output channels relative to the original signals.

As an improvement, the adjustment parameter includes a gain adjustment parameter and/or a delay adjustment parameter and/or a phase adjustment parameter.

The present invention further provides an in-vehicle adaptive sound quality output device, including: a volume level acquisition unit, for obtaining a current volume level input by the user; a calculation unit of audio signal gain difference, used for determining an audio signal gain difference between the current volume level and a baseline volume level according to the current volume level and the preset baseline volume level; a calculation unit of equal loudness curve difference, used for determining the equal loudness curve difference between the current volume level and the baseline volume level according to the audio signal gain difference, the current volume level and the baseline volume level; a calculation unit of audio quality response curve, used for determining the audio quality response curve corresponding to the current volume level according to the equal loudness curve difference and the pre-stored audio quality response curve corresponding to the baseline volume level; and a calculation unit of output signal, used for determining the output signal parameters of multiple audio output channels according to the audio quality response curve corresponding to the current volume level.

The application further provides a car audio system, comprising: a calculation processing module, a storage module, a power amplifier module, a power module; wherein the power module is connected to the calculation processing module to supply power to the car audio system; the calculation processing module is connected to the storage module and the power amplifier module respectively; the power amplifier module is connected to multiple speakers; and wherein a computer program is stored in the storage module, and the calculation processing module implements the in-car adaptive sound quality output method described above when the calculation processing module runs the computer program.

BRIEF DESCRIPTION OF DRAWINGS

Many aspects of the exemplary embodiment can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENTS

Figure 1A:
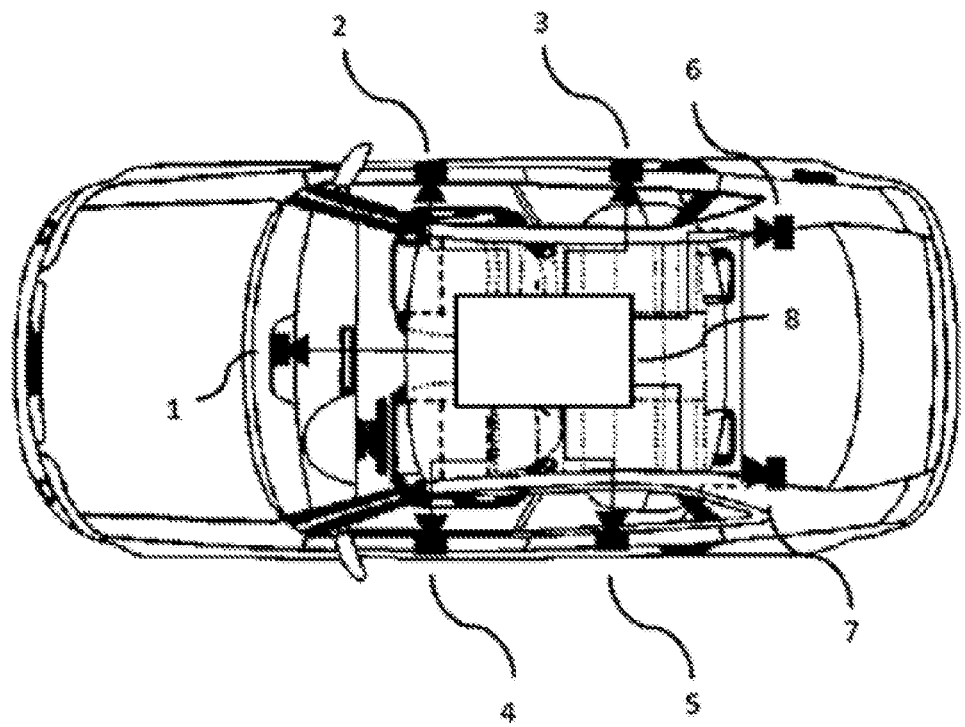
FIG. 1A is a schematic view of the deployment environment of a car audio system and multiple speakers provided by the embodiment of the application.
Figure 1B:
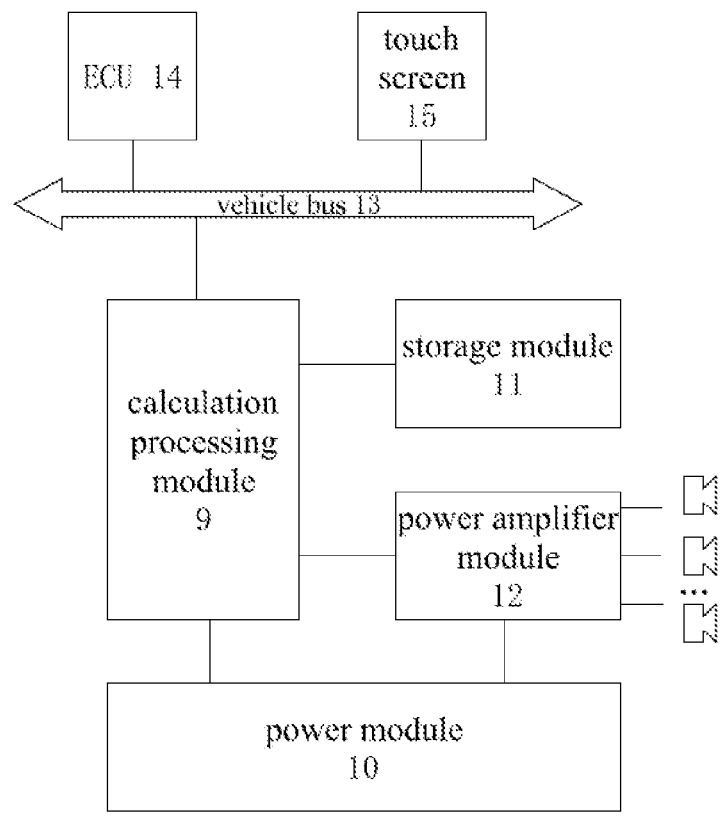
FIG. 1B is a module function box view of a car audio system provided by the embodiment of the application.

See FIG. 1, which is a schematic view for the application scenario of the embodiment of the application. In the embodiment of the application, the application scenarios include car audio system 8 and multiple speakers.

In the embodiment of the application, the car audio system 8 is integrated into the on-board electronic system, and the on-board electronic system also includes a trip computer (ECU, Electronic Control Unit), instrument panel, touch screen and other electronic equipment, and between the electronic equipment It can be connected and communicated through the vehicle bus. The vehicle bus may include, but is not limited to, CAN (Controller Area Network, controller area network), CANFD (CAN with Flexible Data-Rate), LIN (Local Interconnect Network), and the like.

Specifically, referring to FIG. 1, in this application environment, seven iii speakers are used as an example for multiple speakers. Multiple speakers are connected to car audio system 8 as multi-channel output of car audio system 8. Multiple speakers include speaker 1~speaker7. Wherein, the speaker 1 is set at the center stage position in the car, the speaker 2 is set at the position of the right front door of the car, and the speaker 3 is set at the right rear door of the car. The speaker 4 is installed on the left front door of the car. The speaker 5 is installed in the right rear door of the car. The speaker 6 and speaker7 are arranged at the rear C-pillar position of the car. In the embodiment of the application, the car audio system 8 connects 7 speakers through the audio harness, which can provide users with rich listening enjoyment.

In the prior art, when the user adjusts the volume of the car audio system, the sound quality of the multi-channel output cannot be adjusted adaptively. The purpose of the embodiment of the application is to adaptively adjust the outputs of multiple channels according to the volume level input by the user, so as to satisfy the user's acoustic experience.

Figure 2:
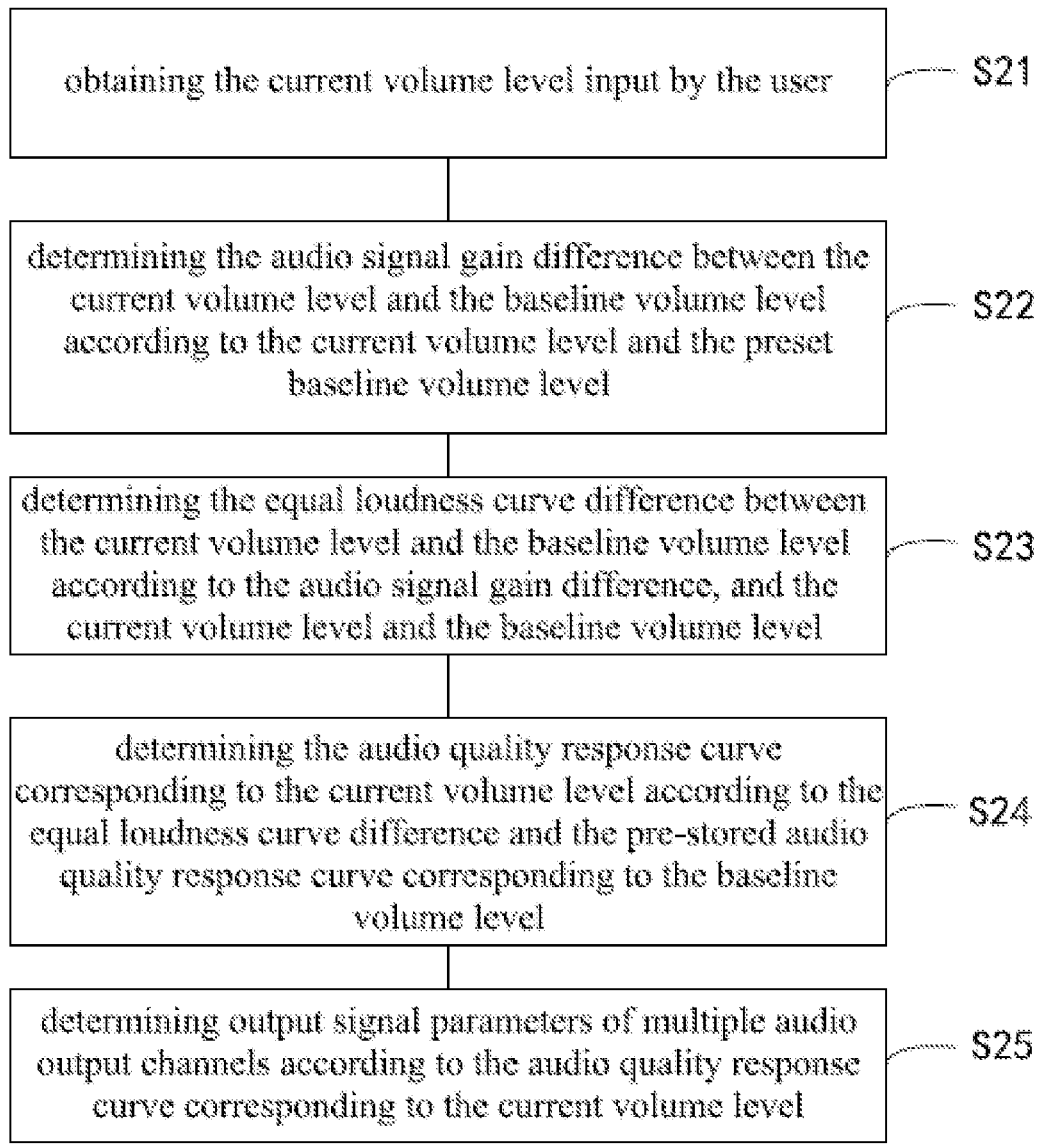
FIG. 2 is a schematic view of the process of the in-car adaptive sound quality output method in the embodiment of the application.

As in FIG. 2, a car audio system is provided in an embodiment of the application.

Specifically, in the embodiment of the application, the car audio system 8 includes a calculation processing module 9, a power module 10, a storage module 11, and a power amplifier module 12.

In the embodiment of the application, the power module 10 performs power supply management for the entire car audio system 8.

The storage module 11 is used to store the computer program, and the calculation processing module 9 executes the computer program to realize the in-car adaptive sound quality output method in the embodiment of the application. The computer program described in the embodiment of the application may include, but is not limited to, software codes and various types of information and figures tables, such as a pre-stored baseline volume level, an equal loudness curve corresponding to the baseline volume level, an audio quality response curve, and the like. The calculation processing module 9 obtains and controls the output parameters of the power amplifier module 12 for each speaker channel.

In the embodiment of the application, the power amplifier module 12 is connected to multiple speakers, and the multiple speakers may be the speaker 1 to the speaker 7 in FIG. 1, and the manner of setting the multiple speakers will not be repeated here.

The calculation processing module 9 in the embodiment of the application can be connected to the ECU 14, the touch screen 15, etc. through the vehicle bus 13, and can communicate with them. For example, under the control of the ECU 14, the user can input the volume level of the audio desired to be heard on the touch screen 15, and the calculation processing module 9 can obtain the user's input and perform calculation processing.

In the embodiment of the application, the calculation processing module 9 executes the computer program in the storage module 11, which can achieve:

S11. Obtain the current volume level input by the user;

S12, according to the current volume level and the preset baseline volume level, determine the audio signal gain difference between the current volume level and the baseline volume level;

S13, according to the audio signal gain difference, and the current volume level and the baseline volume level, determine the equal loudness curve difference between the current volume level and the baseline volume level;

S14. Determine the audio quality response curve corresponding to the current volume level according to the equal loudness curve difference and the pre-stored audio quality response curve corresponding to the baseline volume level;

S15. Determine output signal parameters of multiple audio output channels according to the audio quality response curve corresponding to the current volume level.

The car audio system provided by the application obtains the current volume level input by the user, and then determines the audio signal gain difference between the current volume level and the baseline volume level according to the current volume level and the preset baseline volume level. Determine the equal loudness curve difference between the current volume level and the baseline volume level according to the audio signal gain difference. Then, according to the equal loudness curve difference and the audio quality response curve corresponding to the baseline volume level, determine the audio quality response curve corresponding to the current volume level, and then determine the output signal parameters of multiple audio output channels. The application technical solution enables the car audio system to adjust the sound quality effect adaptively under different volume levels, so as to satisfy the hearing characteristics of the user's human ear, optimize the sound quality effect, and improve the user's acoustic experience.

In the following, in a more detailed embodiment of the application, S11-S15 implemented by the calculation processing module 9 executing the computer program in the storage module 11 will be described.

S11. Obtain the current volume level input by the user;

Specifically, the car audio system will set a default volume level every time it is powered on and restarted (for example, when all electronic systems are turned on in the car), and the default volume level is the baseline volume level. Different users have different hearing systems, and the user can adjust the current volume level. For example, the user can operate on the touch screen 15 to modify the current volume level, and the car audio system can obtain the current volume level through the vehicle bus.

S12, according to the current volume level and the preset baseline volume level, determine the audio signal gain difference between the current volume level and the baseline volume level;

Specifically, the car audio system pre-stores multiple volume levels in the storage module, and the audio signal gain (gain) corresponding to each volume level. The audio signal gain difference between the current volume level and the baseline volume level can be determined according to the current volume level and the preset baseline volume level.

In the embodiment of the application, there are:

$$\text{Delta}_{Gain} = \text{Gain}(\text{Volume}_{Defult}) - \text{Gain}(\text{Volume}_{Customer})$$

Wherein, $\text{Delta}_{Gain}$ represent the audio signal gain difference between the current volume level and the baseline volume level, $\text{Volum}_{Defult}$, $\text{Volume}_{Customer}$ represent the baseline volume level and the current volume level input by the user, $\text{Gain}(\text{Volume}_{Defult})$, $\text{Gain}(\text{Volume}_{Customer})$ respectively, represent the audio signal gain corresponding to the baseline volume level and the signal gain corresponding to the current volume level input by the user.

In the embodiment of the application, the table of volume level and corresponding signal gain is shown in Table 1, where the baseline volume level is volume level 10.

TABLE 1

| volume level | gain (dB) | volume level | gain (dB) | volume level | gain (dB) |
|---|---|---|---|---|---|
| 0 | −100 | 11 | −28 | 22 | −8 |
| 1 | −66 | 12 | −26 | 23 | −7 |
| 2 | −60 | 13 | −24 | 24 | −6 |
| 3 | −54 | 14 | −22 | 25 | −5 |
| 4 | −49 | 15 | −20 | 26 | −4 |
| 5 | −45 | 16 | −18 | 27 | −3 |
| 6 | −42 | 17 | −16 | 28 | −2 |
| 7 | −39 | 18 | −14 | 29 | −1 |
| 8 | −36 | 19 | −12 | 30 | 0 |
| 9 | −33 | 20 | −10 | | |
| 10 | −30 | 21 | −9 | | |

In the embodiment of the application, according to the current volume level, a preset gain table is used to query to obtain the gain value of the audio signal corresponding to the current volume level. According to the preset baseline volume level, the preset gain table is used to query to obtain the gain value of the audio signal corresponding to the baseline volume level. carrying out difference calculation through the gain value of the audio signal corresponding to the baseline volume level, the gain value of the audio signal corresponding to the current volume level, obtaining the audio signal gain difference between the current volume level and the baseline volume level. For example, if the current volume level is 15, and query according to the current volume level, the corresponding gain is −20 dB, and if the baseline volume level is 10, the corresponding gain is −30 dB, then the audio signal gain difference is −10 dB.

S13. Determining an equal loudness curve difference between the current volume level and the baseline volume level according to the audio signal gain difference, the current volume level and the baseline volume level.

Specifically, this step includes: calculating the sound pressure level of the in-car preset reference position at the reference frequency point according to the baseline volume level, and further calculating the equal loudness curve corresponding to the baseline volume level. Then, determining the equal loudness curve corresponding to the current volume level according to the equal loudness curve corresponding to the baseline volume level and the audio signal gain difference, and calculating the equal loudness curve difference between the current volume level and the baseline volume level according to the equal loudness curve corresponding to the baseline volume level and the equal loudness curve corresponding to the current volume level.

In this embodiment, the sound pressure level of the in-car preset reference position and the reference frequency point is calculated, which can be obtained by finding the equal loudness curve through the sound pressure level of the in-vehicle reference position at the reference frequency point. In the embodiment of the application, the preset reference position 15 can be as shown in FIG. 3b, for example, but not limited to the geometric center position of the vehicle. In other scenarios, the reference position can also be the driver position, the front seat passenger position, the rear position, etc. In the embodiment of the application, the reference frequency point can be frequency points such as 500 Hz, 1000 Hz, 2000 Hz, etc. In the embodiment of the application, only 1000 Hz is used as an example.

Figure 3A:
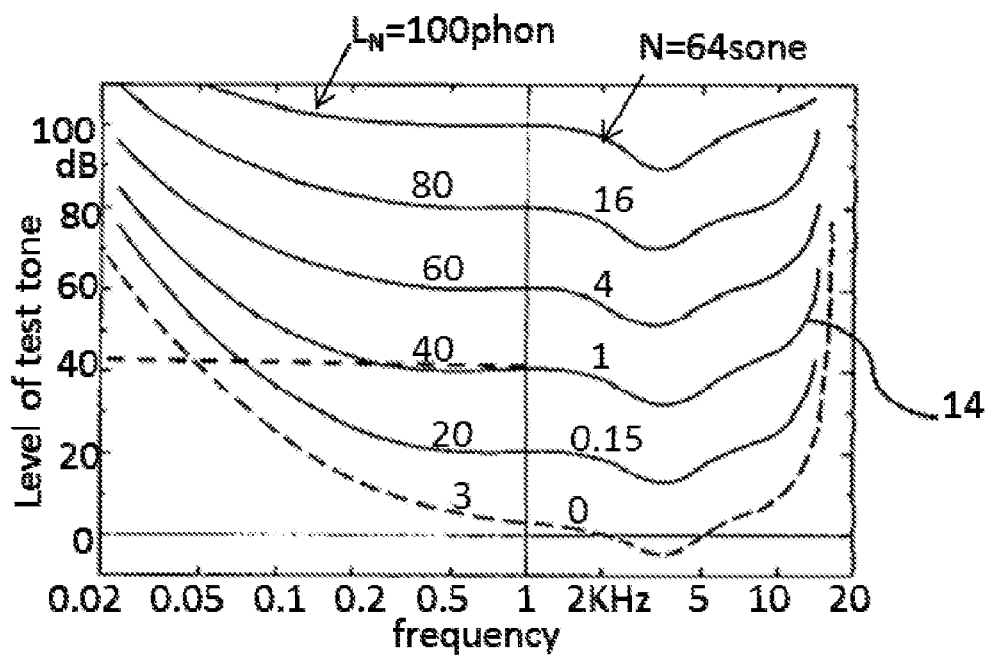
FIG. 3A is an equal loudness curve schematic view provided by the embodiment of the application.
Figure 3B:
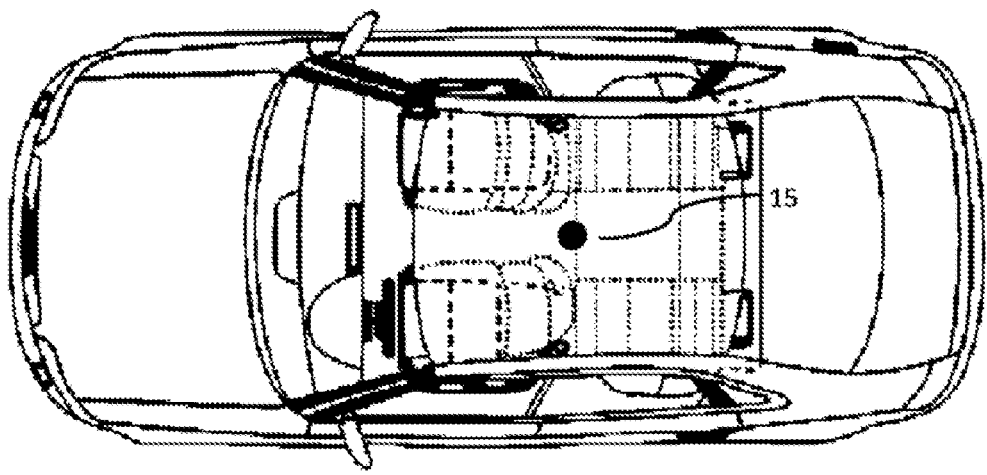
FIG. 3B is a schematic view for measuring the equal loudness curve at the reference position in the car in the embodiment of the application.

FIG. 3a is a schematic view of the equal loudness curve in the embodiment of the application. Taking the baseline volume level as an example, when the reference frequency point is 1000 Hz, the sound pressure level measured at the baseline volume level and the reference position 15 is 42 dB, and the equal loudness curve corresponding to the baseline volume level is curve 14. The curve 14 is a curve related to frequency and sound pressure level, denoted as Loudness ($SPL_{Volume_{Default}}^{@1000\ Hz}$, f), wherein, $SPL_{Volume_{Default}}^{@1000\ Hz}$ represents the sound pressure level of the reference frequency at the reference position at the default volume, which can be obtained by measurement, and f represents the frequency.

Similarly, in the embodiment of the application, the equal loudness curve under the current volume level input by the user can be calculated and denoted as Loudness($SPL_{Volume_{Customer}}^{@1000\ Hz}$, f), wherein, $SPL_{Volume_{Customer}}^{@1000\ Hz}$ represents the sound pressure level of 1000 Hz at the in-vehicle reference position 15 under the current volume input by the user, etc., which can be calculated by the following formula, $$SPL_{Volume_{Customer}}^{@1000\ Hz} = SPL_{Volume_{Default}}^{@1000\ Hz} - \text{Delta}_{Gain}$$

According to the equal loudness curve corresponding to the baseline volume level and the equal loudness curve corresponding to the current volume level, the equal loudness curve difference between the current volume level and the baseline volume level can be calculated, recorded as $\text{Delta}_{Loudness}(f)$.

S14. Determine the audio quality response curve corresponding to the current volume level according to the equal loudness curve difference and the pre-stored audio quality response curve corresponding to the baseline volume level;

In the embodiment of the application, the baseline volume level is the pre-stored volume level, and the audio quality response curve corresponding to the baseline volume level is the pre-stored curve. In the embodiment of the application, the audio quality response curve can be, but is not limited to, a frequency response curve.

Figure 4:
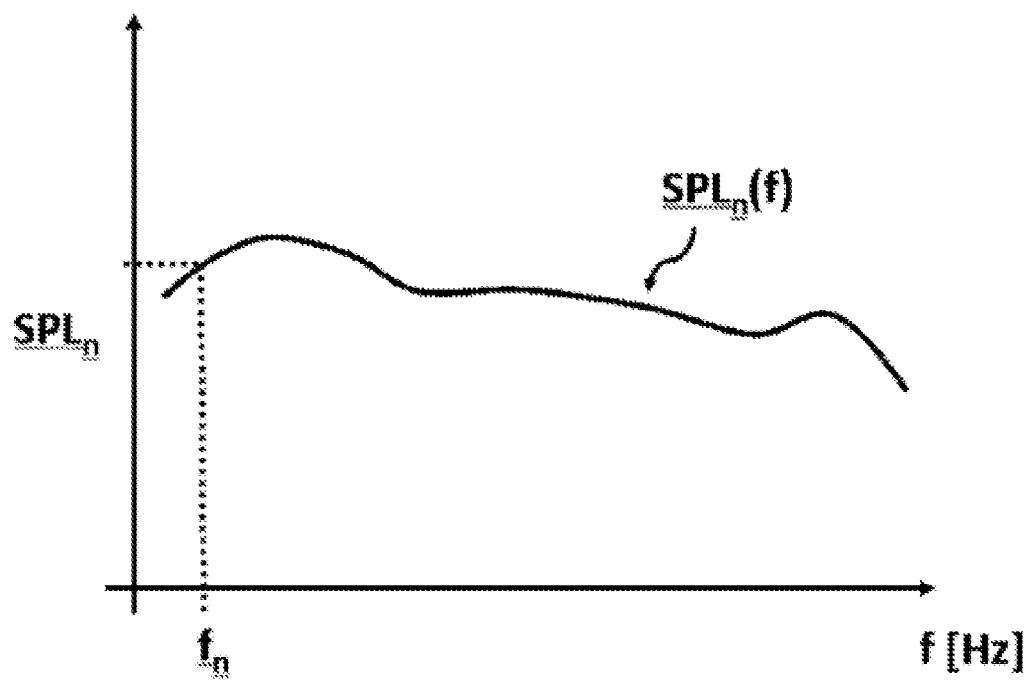
FIG. 4 is a schematic view of the frequency response curve corresponding to the baseline volume level provided by the embedding of the application.

For example, FIG. 4 is a schematic view of the frequency response curve corresponding to the baseline volume level.

The frequency response curve under the baseline volume level in the embodiment of the application is the acoustic response curve at the in-vehicle reference position 15, which can be expressed as the relationship between the frequency f-sound pressure level SPL, for a specific frequency $f_n$, its the corresponding output sound pressure level is $SPL_n$, and this relationship is written as: $SPL_n(f)$. The frequency response characteristics at the baseline volume level can be adjusted according to specific design requirements.

In the embodiment of the application, use the pre-stored audio quality response curve corresponding to the baseline volume level to perform difference calculation with the equal loudness curve difference to obtain the audio quality response curve corresponding to the current volume level, that is:

$$SPL_{Volume_{Customer}}(f) = SPL_{Volume_{Default}}(f) - \text{Delta}_{Loudness}(f)$$

Wherein, $SPL_{Volume_{Customer}}(f)$ represents the frequency response curve corresponding to the current volume level input by the user, and $SPL_{Volume_{Default}}(f)$ represents the frequency response curve under the baseline volume level.

S15. Determine output signal parameters of multiple audio output channels according to the audio quality response curve corresponding to the current volume level.

Figure 5:
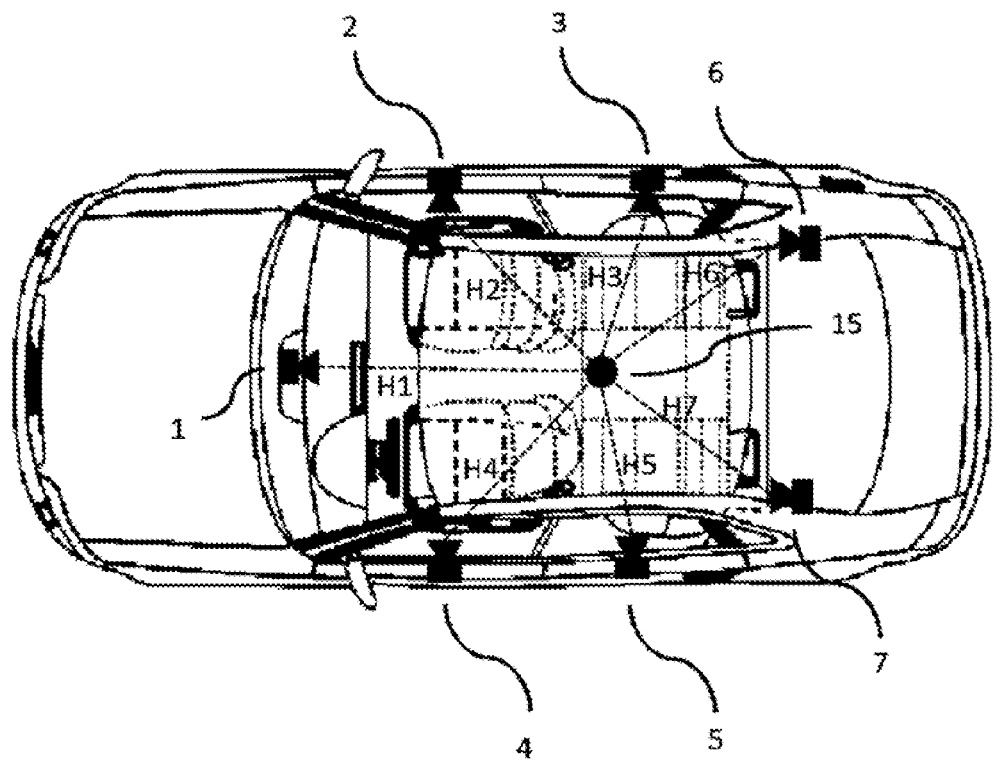
FIG. 5 is a schematic view of the acoustic transfer function of each speaker in the embodiment of the application.

Specifically, as shown in FIG. 5, it is the speaker layout of this embodiment. Wherein, H1, H2, H3, H4, H5, H6, H7 are the acoustic transfer function of speaker 1, speaker 2, speaker 3, speaker 4, speaker 5, speaker 6, speaker7 to reference position15, which can be obtained by direct measurement in the car.

Then under the current volume level input by the user, the frequency response of reference position15 can be expressed as:

$$SPL_{Volume_{Customer}}(f) = [S1\ S2\ S3\ S4\ S5\ S6\ S7]$$

$$\begin{bmatrix} H_{SPK1} & & & & & & 0 \\ & H_{SPK2} & & & & & \\ & & H_{SPK3} & & & & \\ \vdots & & & H_{SPK4} & & & \vdots \\ & & & & H_{SPK5} & & \\ & & & & & H_{SPK6} & \\ 0 & & & \cdots & & & H_{SPK7} \end{bmatrix}$$

$$[H1\ H2\ H3\ H4\ H5\ H6\ H7]^T.$$

Wherein, $H_{SPK1} \sim H_{SPK7}$ represents the acoustic transfer function of speaker 1~speaker7, which can be directly obtained by measuring the acoustic characteristics of the speaker itself.

In the above relationship, $SPL_{Volume_{Customer}}(f)$ is known, H1~H7, $H_{SPK1} \sim H_{SPK7}$ can be measured in advance, then S1~S7 can be calculated. S1~S7 correspond to the output signal parameters of each speaker channel. S1~S7 are the actual sound output signals of each speaker channel.

In the embodiment of the application, the actual sound output signals of the multiple audio output channels are compared with the respective original sound signals, so as to determine the adjustment parameters of the multiple audio output channels relative to the original signals, namely:

$$\text{Signal}_{DSP} = \text{Signal}_{Orignal}(G, T, \Phi)$$

Wherein, $\text{Signal}_{DSP}$ represents the sound signal actually output by the power amplifier module to the speaker, $\text{Signal}_{Orignal}$ represents the original sound signal, and G, T, $\Phi$ respectively represents the gain, delay, and phase adjustments made to the original sound signal.

From the above formula, it can be known that the adjustment parameters include gain adjustment parameter G and/or delay adjustment parameter T and/or phase adjustment parameter $\Phi$.

In the second aspect, an in-car adaptive sound quality output method is provided in an embodiment of the application.

As in FIG. 2, the in-car adaptive sound quality output method in the embodiment of the application includes:

S21. obtaining the current volume level input by the user;

S22. determining the audio signal gain difference between the current volume level and the baseline volume level according to the current volume level and the preset baseline volume level, S23. determining the equal loudness curve difference between the current volume level and the baseline volume level according to the audio signal gain difference, and the current volume level and the baseline volume level, S24. determining the audio quality response curve corresponding to the current volume level according to the equal loudness curve difference and the pre-stored audio quality response curve corresponding to the baseline volume level;

S25. determining output signal parameters of multiple audio output channels according to the audio quality response curve corresponding to the current volume level.

The in-car adaptive sound quality output method provided by the embodiment of the application obtains the current volume level input by the user. Then, according to the current volume level and the preset baseline volume level, determine the audio signal gain difference between the current volume level and the baseline volume level. Determine the equal loudness curve difference between the current volume level and the baseline volume level according to the audio signal gain difference. Then, according to the equal loudness curve difference and the audio quality response curve corresponding to the baseline volume level, determine the audio quality response curve corresponding to the current volume level, and then determine the output signal parameters of multiple audio output channels. The application technical solution enables the car audio system to adjust the sound quality effect adaptively under different volume levels, so as to satisfy the hearing characteristics of the user's human ear, optimize the sound quality effect, and improve the user's acoustic experience.

In the following, in a more detailed embodiment of the application, S21-S25 in the above method flow are described.

S21. obtaining the current volume level input by the user;

Specifically, the car audio system will set a default volume level every time it is powered on and restarted (for example, when all electronic systems are turned on in the car), and the default volume level is the baseline volume level. Different users have different hearing systems, and the user can adjust the current volume level. For example, the user can operate on the touch screen 15 to modify the current volume level, and the car audio system can obtain the current volume level through the vehicle bus.

S22. determining the audio signal gain difference between the current volume level and the baseline volume level according to the current volume level and the preset baseline volume level, Specifically, the car audio system pre-stores multiple volume levels in the storage module, and the audio signal gain (gain) corresponding to each volume level. The audio signal gain difference between the current volume level and the baseline volume level can be determined according to the current volume level and the preset baseline volume level.

In the embodiment of the application, there are:

$$\text{Delta}_{Gain} = \text{Gain}(\text{Volume}_{Defult}) - \text{Gain}(\text{Volume}_{Customer})$$

Wherein, $\text{Delta}_{Gain}$ represent the audio signal gain difference between the current volume level and the baseline volume level, $\text{Volum}_{Defult}$, $\text{Volum}_{Customer}$ represent the baseline volume level and the current volume level input by the user, $\text{Gain}(\text{Volume}_{Defult})$, $\text{Gain}(\text{Volume}_{Customer})$ respectively, represent the audio signal gain corresponding to the baseline volume level and the signal gain corresponding to the current volume level input by the user.

In the embodiment of the application, the table of volume level and corresponding signal gain is shown in Table 1, where the baseline volume level is volume level 10.

TABLE 1

| volume level | gain (dB) | volume level | gain (dB) | volume level | gain (dB) |
| --- | --- | --- | --- | --- | --- |
| 0 | −100 | 11 | −28 | 22 | −8 |
| 1 | −66 | 12 | −26 | 23 | −7 |
| 2 | −60 | 13 | −24 | 24 | −6 |
| 3 | −54 | 14 | −22 | 25 | −5 |
| 4 | −49 | 15 | −20 | 26 | −4 |
| 5 | −45 | 16 | −18 | 27 | −3 |
| 6 | −42 | 17 | −16 | 28 | −2 |
| 7 | −39 | 18 | −14 | 29 | −1 |

TABLE 1-continued

| volume level | gain (dB) | volume level | gain (dB) | volume level | gain (dB) |
| --- | --- | --- | --- | --- | --- |
| 8 | −36 | 19 | −12 | 30 | 0 |
| 9 | −33 | 20 | −10 | | |
| 10 | −30 | 21 | −9 | | |

In the embodiment of the application, according to the current volume level, a preset gain table is used to query to obtain the gain value of the audio signal corresponding to the current volume level. According to the preset baseline volume level, the preset gain table is used to query to obtain the gain value of the audio signal corresponding to the baseline volume level. carrying out difference calculation through the gain value of the audio signal corresponding to the baseline volume level, the gain value of the audio signal corresponding to the current volume level, obtaining the audio signal gain difference between the current volume level and the baseline volume level. For example, if the current volume level is 15, and query according to the current volume level, the corresponding gain is −20 dB, and if the baseline volume level is 10, the corresponding gain is −30 dB, then the audio signal gain difference is −10 dB.

S23. Determine an equal loudness curve difference between the current volume level and the baseline volume level according to the audio signal gain difference, the current volume level and the baseline volume level.

Specifically, this step includes: calculating the sound pressure level of the in-car preset reference position at the reference frequency point according to the baseline volume level, and further calculating the equal loudness curve corresponding to the baseline volume level. Then, determining the equal loudness curve corresponding to the current volume level according to the equal loudness curve corresponding to the baseline volume level and the audio signal gain difference, and calculating the equal loudness curve difference between the current volume level and the baseline volume level according to the equal loudness curve corresponding to the baseline volume level and the equal loudness curve corresponding to the current volume level.

In this embodiment, the sound pressure level of the in-car preset reference position and the reference frequency point is calculated, which can be obtained by finding the equal loudness curve through the sound pressure level of the in-vehicle reference position at the reference frequency point. In the embodiment of the application, the preset reference position 15 can be as shown in FIG. 3b, for example, but not limited to the geometric center position of the vehicle. In other scenarios, the reference position can also be the driver position, the front seat passenger position, the rear position, etc. In the embodiment of the application, the reference frequency point can be frequency points such as 500 Hz, 1000 Hz, 2000 Hz, etc. In the embodiment of the application, only 1000 Hz is used as an example.

FIG. 3a is a schematic view of the equal loudness curve in the embodiment of the application. Taking the baseline volume level as an example, when the reference frequency point is 1000 Hz, the sound pressure level measured at the baseline volume level and the reference position 15 is 42 dB, and the equal loudness curve corresponding to the baseline volume level is curve 14. The curve 14 is a curve related to frequency and sound pressure level, denoted as Loudness ($\text{SPL}_{Volume_{Defult}}^{@1000\ Hz}$, f), wherein, $\text{SPL}_{Volume_{Defult}}^{@1000\ Hz}$ represents the sound pressure level of the reference frequency at the reference position at the default volume, which can be obtained by measurement, and f represents the frequency.

Similarly, in the embodiment of the application, the equal loudness curve under the current volume level input by the user can be calculated and denoted as Loudness($SPL_{Volume_{Customer}}@1000\ Hz$, f), wherein, $SPL_{Volume_{Customer}}@1000\ Hz$ represents the sound pressure level of 1000 Hz at the in-vehicle reference position 15 under the current volume input by the user, etc., which can be calculated by the following formula, $$SPL_{Volume_{Customer}}@1000\ Hz = SPL_{Volume_{Defult}}@1000\ Hz - Delta_{Gain}$$

According to the equal loudness curve corresponding to the baseline volume level and the equal loudness curve corresponding to the current volume level, the equal loudness curve difference between the current volume level and the baseline volume level can be calculated, recorded as $Delta_{Loudness}(f)$.

S24. determining the audio quality response curve corresponding to the current volume level according to the equal loudness curve difference and the pre-stored audio quality response curve corresponding to the baseline volume level;

In the embodiment of the application, the baseline volume level is the pre-stored volume level, and the audio quality response curve corresponding to the baseline volume level is the pre-stored curve. In the embodiment of the application, the audio quality response curve can be, but is not limited to, a frequency response curve.

For example, FIG. 4 is a schematic view of the frequency response curve corresponding to the baseline volume level.

The frequency response curve under the baseline volume level in the embodiment of the application is the acoustic response curve at the in-vehicle reference position 15, which can be expressed as the relationship between the frequency f-sound pressure level SPL, for a specific frequency $f_n$, its the corresponding output sound pressure level is $SPL_n$, and this relationship is written as: $SPL_n(f)$. The frequency response characteristics at the baseline volume level can be adjusted according to specific design requirements.

In the embodiment of the application, use the pre-stored audio quality response curve corresponding to the baseline volume level to perform difference calculation with the equal loudness curve difference to obtain the audio quality response curve corresponding to the current volume level, that is:

$$SPL_{Volume_{Customer}}(f) = SPL_{Volume_{Defult}}(f) - Delta_{Loudness}(f)$$

Wherein, $SPL_{Volume_{Customer}}(f)$ represents the frequency response curve corresponding to the current volume level input by the user, and $SPL_{Volume_{Defult}}(f)$ represents the frequency response curve under the baseline volume level.

S25. determining output signal parameters of multiple audio output channels according to the audio quality response curve corresponding to the current volume level.

Specifically, as shown in FIG. 5, it is the speaker layout of this embodiment. Wherein, H1, H2, H3, H4, H5, H6, H7 are the acoustic transfer function of speaker 1, speaker 2, speaker 3, speaker 4, speaker 5, speaker 6, speaker7 to reference position15, which can be obtained by direct measurement in the car.

Then under the current volume level input by the user, the frequency response of reference position15 can be expressed as:

$$SPL_{Volume_{Customer}}(f) = [S1\ S2\ S3\ S4\ S5\ S6\ S7]$$

-continued $$\begin{bmatrix} H_{SPK1} & & & & & & 0 \\ & H_{SPK2} & & & & & \\ & & H_{SPK3} & & & & \\ \vdots & & & H_{SPK4} & & & \vdots \\ & & & & H_{SPK5} & & \\ & & & & & H_{SPK6} & \\ 0 & & & & & & H_{SPK7} \end{bmatrix}$$

$$[H1\ H2\ H3\ H4\ H5\ H6\ H7]^T.$$

Wherein, $H_{SPK1} \sim H_{SPK7}$ represents the acoustic transfer function of speaker 1~speaker7, which can be directly obtained by measuring the acoustic characteristics of the speaker itself.

In the above relationship, $SPL_{Volume_{Customer}}(f)$ is known, H1~H7, $H_{SPK1} \sim H_{SPK7}$ can be measured in advance, then S1~S7 can be calculated. S1~S7 correspond to the output signal parameters of each speaker channel. S1~S7 are the actual sound output signals of each speaker channel.

In the embodiment of the application, the actual sound output signals of the multiple audio output channels are compared with the respective original sound signals, so as to determine the adjustment parameters of the multiple audio output channels relative to the original signals, namely:

$$Signal_{DSP} = Signal_{Orignal}(G, T, \Phi)$$

Wherein, $Signal_{DSP}$ represents the sound signal actually output by the power amplifier module to the speaker, $Signal_{Orignal}$ represents the original sound signal, and G, T, φ respectively represents the gain, delay, and phase adjustments made to the original sound signal.

From the above formula, it can be known that the adjustment parameters include gain adjustment parameter G and/or delay adjustment parameter T and/or phase adjustment parameter Φ.

Figure 6:
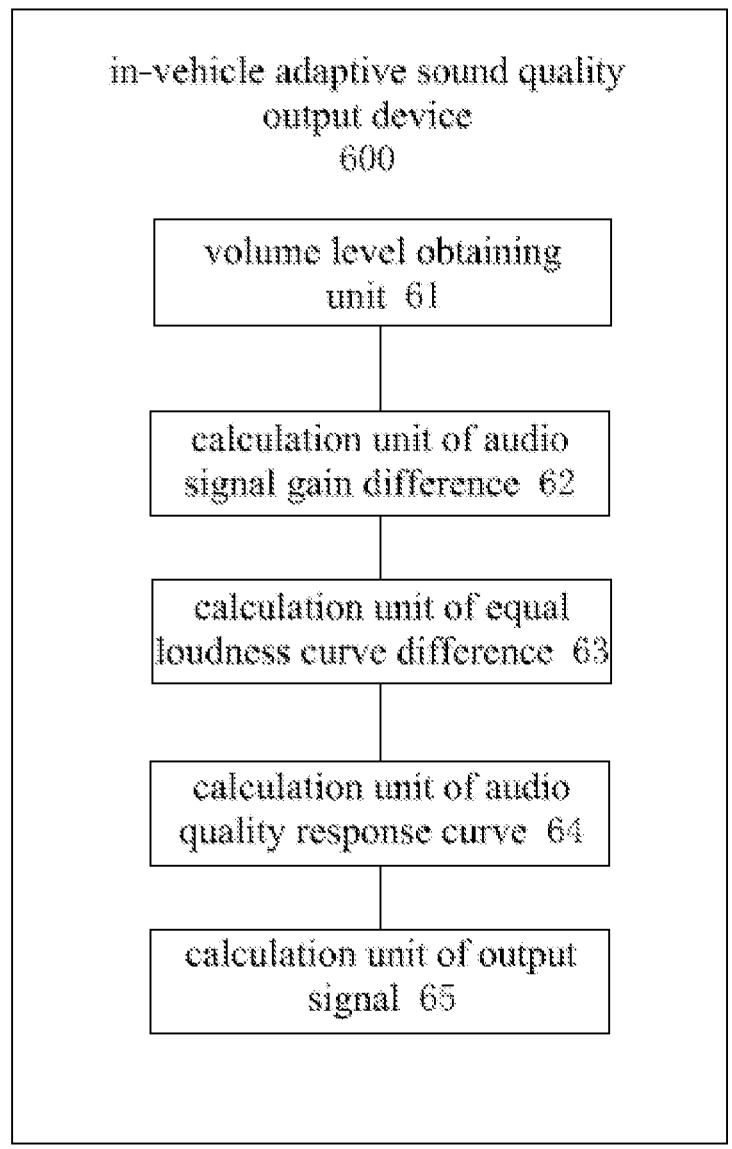
FIG. 6 is the functional box view of the in-car adaptive sound quality output device provided by the embodiment of the application.

As shown in FIG. 6, the embedding of the application also provides an in-vehicle adaptive sound quality output device.

The in-vehicle adaptive sound quality output device 600 in the embodiment of the application includes:

a volume level obtaining unit 61, used to obtain the current volume level input by the user;

a calculation unit of audio signal gain difference 62, for determining the audio signal gain difference between the current volume level and the baseline volume level according to the current volume level and the preset baseline volume level;

a calculation unit of equal loudness curve difference 63, used to determine an equal loudness curve between the current volume level and the baseline volume level according to the audio signal gain difference, the current volume level and the baseline volume level difference;

a calculation unit of audio quality response curve 64, used to determine the audio quality response curve corresponding to the current volume level according to the equal loudness curve difference and the pre-stored audio quality response curve corresponding to the baseline volume level;

a calculation unit of output signal 65, used to determine output signal parameters of multiple audio output channels according to the audio quality response curve corresponding to the current volume level.

The device in the embodiment of the application can be, but is not limited to, applied to the calculation processing module in the car audio system. When the computer program in the storage module is executed, the in-car adaptive sound quality output method in the aforementioned embodiment can be implemented.

In the embodiment of the application, a storage medium is also provided, and a computer program is stored in the storage medium, and when the computer program is executed, the in-car adaptive sound quality output method in the aforementioned embodiment is implemented. The specific method process will not be repeated here.

Among the several embodiments provided by the present invention, it should be understood that the disclosed systems, devices and methods can be implemented in other ways. For example, the device embodiment described above is only illustrative. For example, the division of the units is only a logical function division. In actual implementation, there may be other division methods. For example, multiple units or components may be combined or integrated to another system, or some features can be ignored, or not implemented. On the other hand, the shown or discussed mutual coupling or direct coupling or communication connection may be through some interfaces, indirect coupling or communication connection of devices or units, which may be in electrical, mechanical or other forms.

The integrated units implemented in the form of software functional units can be stored in a computer-readable storage medium. The software functional units are stored in a storage medium, and include several instructions to make a computer device (which may be a personal computer, a server, or a network device, etc.) or a processor (Processor) to execute part of the steps of the methods of each embodiment of the present invention. The aforementioned storage medium includes: a U disk, a mobile hard disk, a read-only memory unit (Read-Only Memory, ROM), a random-access memory unit (Random Access Memory, RAM), a magnetic disk or an optical disk and other media that which can store program codes.

What is claimed is:

1. An in-car adaptive sound quality output method, including steps of:
   obtaining a current volume level entered by the user;
   determining an audio signal gain difference between the current volume level and a baseline volume level according to the current volume level and a preset baseline volume level,
   determining an equal loudness curve difference between the current volume level and the baseline volume level according to the audio signal gain difference, the current volume level and the baseline volume level;
   determining an audio quality response curve corresponding to the current volume level according to the equal loudness curve difference and the pre-stored audio quality response curve corresponding to the baseline volume level; and
   determining an output signal parameters of multiple audio output channels according to the audio quality response curve corresponding to the current volume level.

2. The method as described in claim 1, wherein the step of determining the audio signal gain difference between the current volume level and the baseline volume level according to the current volume level and a preset baseline volume level, includes steps of:
   using the preset gain table to query, obtaining the gain value of the audio signal corresponding to the current volume level, according to the current volume level;
   using the preset gain table to query and obtaining the gain value of the audio signal corresponding to the baseline volume level according to the preset baseline volume level;
   carrying out difference calculation through the gain value of the audio signal corresponding to the baseline volume level, the gain value of the audio signal corresponding to the current volume level, obtaining the audio signal gain difference between the current volume level and the baseline volume level.

3. The method as described in claim 2, wherein determining the equal loudness curve difference between the current volume level and the baseline volume level according to the audio signal gain difference, and the current volume level and the baseline volume level, includes steps of:
   calculating the sound pressure level of the in-car preset reference position at the reference frequency point according to the baseline volume level, and further calculating the equal loudness curve corresponding to the baseline volume level;
   determining the equal loudness curve corresponding to the current volume level according to the equal loudness curve corresponding to the baseline volume level and the audio signal gain difference;
   calculating the equal loudness curve difference between the current volume level and the baseline volume level according to the equal loudness curve corresponding to the baseline volume level and the equal loudness curve corresponding to the current volume level.

4. The method as described in claim 3, wherein determining the audio quality corresponding to the current volume level according to the equal loudness curve difference and the pre-stored audio quality response curve corresponding to the baseline volume level response curve, includes steps of:
   using the pre-stored audio quality response curve corresponding to the baseline volume level, and the equal loudness curve difference, performing difference calculation, obtaining the audio quality response curve corresponding to the current volume level.

5. The method as described in claim 4, wherein the audio quality response curve is specifically a frequency response curve.

6. The method as described in claim 1, wherein the step of determining the output signal parameters of multiple audio output channels according to the audio quality response curve corresponding to the current volume level, includes steps of:
   determining the actual sound output signals of multiple audio output channels according to the audio quality response curve corresponding to the current volume level and the preset acoustic transfer relationship;
   comparing actual sound output signals of the multiple audio output channels with the respective original sound signals, then determining the adjustment parameters of the multiple audio output channels relative to the original signals.

7. The method as described in claim 6, wherein the adjustment parameter includes a gain adjustment parameter and/or a delay adjustment parameter and/or a phase adjustment parameter.

8. An in-vehicle adaptive sound quality output device, including:
   a volume level acquisition unit, for obtaining a current volume level input by the user;

a calculation unit of audio signal gain difference, used for determining an audio signal gain difference between the current volume level and a baseline volume level according to the current volume level and the preset baseline volume level;

a calculation unit of equal loudness curve difference, used for determining the equal loudness curve difference between the current volume level and the baseline volume level according to the audio signal gain difference, the current volume level and the baseline volume level;

a calculation unit of audio quality response curve, used for determining the audio quality response curve corresponding to the current volume level according to the equal loudness curve difference and the pre-stored audio quality response curve corresponding to the baseline volume level; and a calculation unit of output signal, used for determining the output signal parameters of multiple audio output channels according to the audio quality response curve corresponding to the current volume level.

9. A car audio system, comprising: a calculation processing module, a storage module, a power amplifier module, a power module; wherein the power module is connected to the calculation processing module to supply power to the car audio system; the calculation processing module is connected to the storage module and the power amplifier module respectively; the power amplifier module is connected to multiple speakers; and wherein a computer program is stored in the storage module, and the calculation processing module implements the in-car adaptive sound quality output method described in claim 1 when the calculation processing module runs the computer program.

* * * * *